(12) United States Patent
Tsai

(10) Patent No.: US 6,831,352 B1
(45) Date of Patent: Dec. 14, 2004

(54) SEMICONDUCTOR PACKAGE FOR HIGH FREQUENCY PERFORMANCE

(75) Inventor: Johnson Tsai, Jung Li (TW)

(73) Assignee: Azimuth Industrial Company, Inc., Hayward, CA (US)

( * ) Notice: Subject to any disclaimer, the term of this patent is extended or adjusted under 35 U.S.C. 154(b) by 0 days.

(21) Appl. No.: 09/425,503

(22) Filed: Oct. 22, 1999

Related U.S. Application Data

(60) Provisional application No. 60/105,521, filed on Oct. 22, 1998.

(51) Int. Cl.$^7$ .............................................. H01L 23/495
(52) U.S. Cl. ...................... 257/666; 257/670; 257/671; 257/676; 257/684; 257/692; 257/693; 257/696; 257/698; 257/717
(58) Field of Search ................................. 257/666, 670, 257/672, 676, 723, 728, 671, 675, 684, 692, 693, 696, 698, 706–707, 711–712, 717, 796

(56) References Cited

U.S. PATENT DOCUMENTS

| | | | | |
|---|---|---|---|---|
| 4,839,713 A | * | 6/1989 | Teraoka et al. ................ 357/70 |
| 4,855,807 A | * | 8/1989 | Yamaji et al. ................. 357/72 |
| 5,442,234 A | * | 8/1995 | Liang .......................... 257/675 |
| 5,471,088 A | * | 11/1995 | Song ........................... 257/668 |
| 5,497,033 A | * | 3/1996 | Fillion et al. ................ 257/723 |
| 5,606,199 A | * | 2/1997 | Yoshigai ...................... 257/666 |
| 5,633,528 A | * | 5/1997 | Abbott et al. ................ 257/666 |
| 5,767,528 A | * | 6/1998 | Sumi et al. .................... 257/48 |
| 5,869,883 A | * | 2/1999 | Mehringer et al. .......... 257/667 |
| 6,054,753 A | * | 4/2000 | Inaba .......................... 257/646 |
| 6,198,163 B1 | * | 3/2001 | Crawley et al. ............. 257/706 |
| 6,246,110 B1 | * | 6/2001 | Kinsman et al. ............ 257/672 |

FOREIGN PATENT DOCUMENTS

| EP | 0 902 473 A2 | * | 3/1999 |
| JP | 7-142662 A | * | 6/1985 |
| JP | 7 142662 A | * | 6/1985 |

* cited by examiner

*Primary Examiner*—Nathan Flynn
*Assistant Examiner*—Ahmed N. Sefer
(74) *Attorney, Agent, or Firm*—Justin Boyce; Tamiz Khan; Oppenheimer Wolff & Donnelly LLP

(57) ABSTRACT

An improved lead frame structure for use in a semiconductor package, including: a plurality of leads; a paddle structure electrically isolated from the leads, the paddle structure including at least one lower paddle section having a first top surface to which a die may be attached, at least one mesa section disposed proximate the paddle section and having a second top surface disposed at a different elevation than the first top surface, the lower paddle section and the mesa section being joined by a wall section; and a plurality of tie bars attached to the paddle structure for supporting the paddle structure; whereby contact pads of a die attached to the first top surface may be electrically connected to the second top surface and to the leads prior to encapsulation thereof. A plurality of tie bars extends from opposite edges of the paddle structure, the tie bars providing for stabilizing the paddle structure during package fabrication.

35 Claims, 6 Drawing Sheets

SEMICONDUCTOR PACKAGE FOR HIGH FREQUENCY PERFORMANCE

This application claims benefit of Provisional Appln No. 60/105,521 filed Oct. 22, 1998.

BACKGROUND OF THE INVENTION

1. Field of the Invention

The present invention relates generally to integrated circuit assembly, and more specifically to a method and apparatus for packaging a semiconductor device in order to achieve optimal high frequency performance of the device.

2. Description of the Prior Art

Integrated circuit assembly includes semiconductor packaging wherein a semiconductor device, referred to as a die or chip, is placed in a sealed environment to protect the device from exposure to outside elements. In accordance with typical semiconductor packaging methods, a die is attached to a paddle, or die flag, of a metal lead frame, and encapsulated in a plastic package. Typical packaging methods include forming an assembly by mounting a die to a lead frame using an epoxy, connecting bond pads of the die to the lead frame using gold or aluminum wires, and sealing the entire assembly using lids or thermoplastic setting compounds.

FIG. 1A shows a top plan view of a conventional semiconductor package at 10, the package 10 including a package body 12 having a lead frame (not shown), the lead frame having a paddle area indicated by a dashed line 14. The package body 12 is encapsulated in plastic, and of leads 16 of the lead frame extend outward from opposite sides of the package. FIG. 1B shows a side elevation view at 20 of the semiconductor package 10. Each of the leads 16 includes a lead foot 22 which provides for mounting the semiconductor package onto a board (not shown). As shown in FIG. 1B, the leads 16 may extend downward to a point even with a bottom surface 24 of the package. FIG. 1C shows an alternative configuration of a typical semiconductor package at 30 wherein a plurality of leads 32 of a lead frame extend downward beyond the bottom surface 24 of the package.

Semiconductor devices are usually packaged in accordance with a packaging technique that is suited to achieve specific performance requirements of the particular device. Many types of semiconductor devices have specific requirements for electrical grounding, heat dissipation, and power dissipation. For high frequency semiconductor devices, electrical grounding is an important design consideration because of the effect of electrical impedance, and particularly inductive impedance, on high frequency performance.

In one type of semiconductor device package, a bottom portion of the paddle of the lead frame is exposed, and forms a lower surface of the semiconductor package. The exposed portion of the paddle structure provides for enhanced heat dissipation. When affixed to a contact area of a circuit board, the exposed portion of the paddle provides electrical grounding for the semiconductor package. Selected bond pads of the die may be connected to the grounded paddle via ground wires. In a conventional semiconductor package, the ground wires traverse relatively large distances.

FIG. 2A shows a cross sectional side view of a conventional semiconductor package device at 36, the device including a die 38 attached to a flat paddle 40 formed by a planar member of a lead frame. The lead frame and die are encapsulated in plastic 44. A bottom portion 45 of the paddle 40 is exposed, and forms a lower surface of the semiconductor package 36. The exposed portion 45 of the paddle provides for enhanced heat dissipation. When affixed to a contact area of a circuit board, the exposed portion 45 of the paddle 40 provides electrical grounding of the paddle. Selected bond pads (not shown) of the die 38 are attached to the paddle 40 by ground wires 42. Because of the planar shape of the paddle 40, the ground wires 42 must extend a relatively long distance to connect the bond pads at the top surface of the die 38 to the surface of the paddle 40. The impedance of the relatively long ground wires 42 causes inductance effects at high frequencies which may result in excessive ringing and noise in the performance of the device. What is needed is a method and apparatus for packaging high frequency semiconductor devices wherein the lengths of grounding wires are minimized in order to minimize excessive inductance effects which could compromise the performance of the device.

Thermal dissipation is another important design consideration in packaging techniques for many different types of devices. Therefore, what is also needed is a method and apparatus for packaging high frequency semiconductor devices wherein thermal dissipation is optimized.

SUMMARY OF THE INVENTION

It is an object of the present invention to provide a method and apparatus for packaging high frequency semiconductor devices wherein the lengths of grounding wires are minimized in order to minimize excessive inductance effects which could compromise the performance of the device.

It is also an object of the present invention to provide a method and apparatus for packaging high frequency semiconductor devices wherein thermal dissipation is optimized.

Briefly, a presently preferred embodiment of the present invention provides an improved lead frame structure for use in a semiconductor package. The lead frame structure includes: a plurality of leads; a paddle structure electrically isolated from the leads, the paddle structure including at least one lower paddle section having a first top surface to which a die may be attached, at least one mesa section disposed proximate the paddle section and having a second top surface disposed at a different elevation than the first top surface, the lower paddle section and the mesa section being joined by a wall section; and a plurality of tie bars attached to the paddle structure for supporting the paddle structure; whereby contact pads of a die attached to the first top surface may be electrically connected to the second top surface and to the leads prior to encapsulation thereof. A plurality of tie bars extends from opposite edges of the paddle structure, the tie bars providing for stabilizing the paddle structure during package fabrication.

In one embodiment, the paddle section of the paddle structure is formed by a planar member having a substantially rectangular shape, wherein the mesa section surrounds the lower paddle section.

In another embodiment, the second top surface comprises a continuous surface that surrounds the first top surface. The paddle structure is formed by coining a generally rectangular lead frame portion having a plurality of relief holes disposed proximate corners thereof.

In a further embodiment, the paddle structure comprises a plurality of mesa sections disposed at opposite sides of the lower paddle section. At least one of the leads may include: a lead stitch post disposed at a distal end of the lead and providing a surface for wire bonding; an upper lead section disposed at a different elevation than the lead stitch post; and a medial riser section joining the lead stitch post and the upper lead section.

An important advantage of the semiconductor device package of the present invention is that the mesa section of the paddle structure enables the use of shorter grounding wires which allow for reduced inductive impedance. This reduction in inductive impedance enables enhanced high frequency performance of the device by minimizing excessive inductance effects which would compromise the performance of the device.

The foregoing and other objects, features, and advantages of the present invention will be apparent from the following detailed description of the preferred embodiment which makes reference to the several figures of the drawing.

IN THE DRAWING

Figure 11:
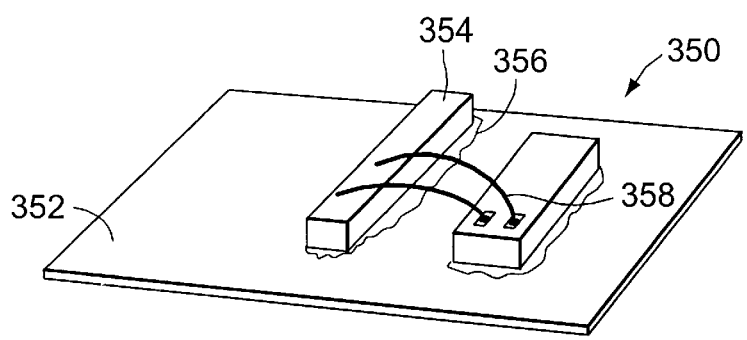
Figure 12:
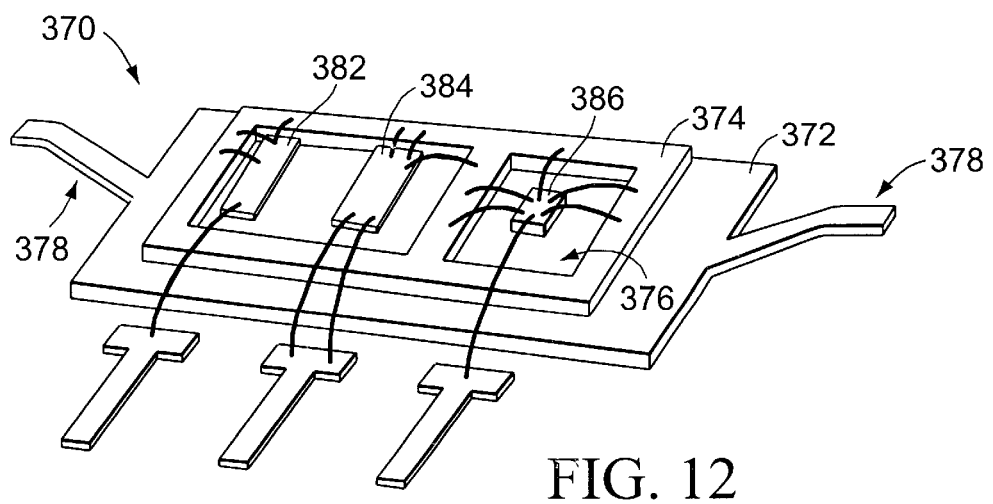

FIG. 11 is a perspective view of a lead frame in accordance with an additional embodiment of the present invention, the depicted lead frame including a flat paddle area and an attached mesa which may be variably located; and FIG. 12 is a perspective view of a lead frame in accordance with yet another embodiment of the present invention, the depicted lead frame including a flat paddle area and an attached framed or stamped mesa structure.

DETAILED DESCRIPTION OF THE PREFERRED EMBODIMENTS

Figure 1A:
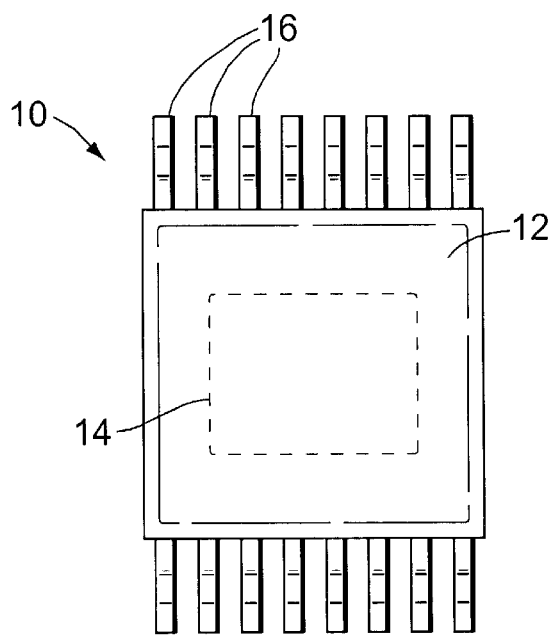
FIGS. 1A through 1C are views of a typical semiconductor package.
Figure 1B:
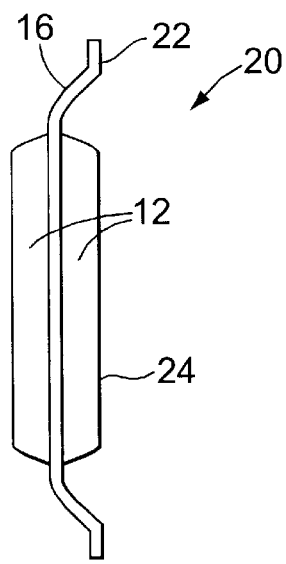
Figure 1C:
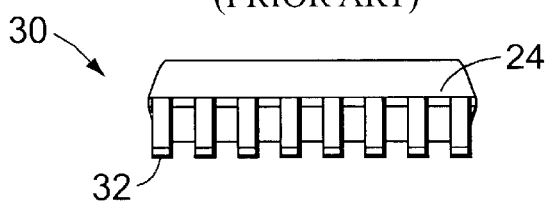
Figure 2A:
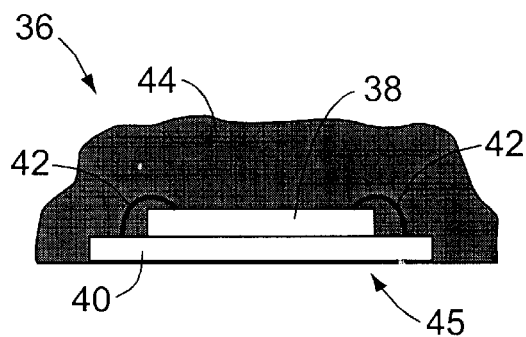
FIG. 2A is a cross sectional view of a conventional semiconductor package device including a die attached to a flat paddle formed by a planar member of a lead frame.
Figure 2B:
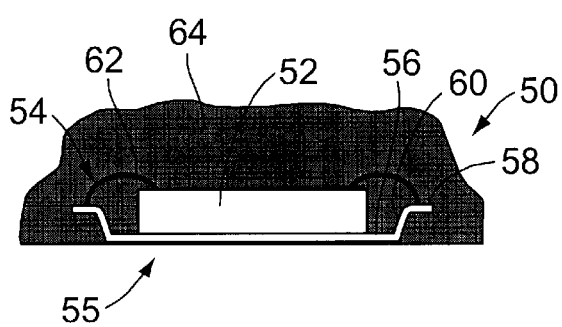
FIG. 2B is a cross sectional side view of a high frequency semiconductor package device including a die attached to a lead frame having a down set paddle structure in accordance with the present invention.

FIG. 2B shows a cross sectional side view of a semiconductor package device at 50 in accordance with the present invention, the device 50 including a die 52 attached to a down set paddle structure 54 including a medially, or centrally, disposed lower paddle section 56 having a top surface upon which the die 52 is attached; upper mesa sections 58 having a top surface disposed at a distance relative to the lower paddle section; and connecting walls 60 fixed between the lower paddle section 56 and the upper mesa sections 58 of the paddle structure. A bottom side 55 of the down set paddle structure 54 is exposed, and forms a lower surface of the semiconductor package 50. The exposed portion of the paddle structure provides for enhanced heat dissipation. When affixed to a contact area of a circuit board, the exposed portion of the paddle structure also provides electrical grounding for the semiconductor package. In one embodiment, the down set paddle structure 54 is formed in accordance with a coining, or stamping, or etching process as further explained below. The coining reduces moisture penetration into the top side of the paddle structure area.

Selected bond pads (not shown) of the die 52 are grounded by being attached to the upper mesa section 58 of the down set paddle structure 54 by ground wires 62. The lead frame and die are encapsulated in plastic 64. The distance between the upper surface of the die 52 and the upper mesa section 58 of the down set paddle structure is smaller than the distance between the upper surface of the die and the lower paddle section 56 of the paddle structure 54. The closer proximity of the upper mesa section 58 to the upper surface of the die enables the use of ground wires 62 which are relatively shorter than the ground wires 42 (FIG. 2A) used to connect the bond pads of the die to the flat paddle 40 (FIG. 2A) in the prior art semiconductor package device. The reduced impedance of the relatively shorter ground wires 62 reduces undesirable inductance effects in the performance of the die 52 at high frequencies thereby reducing ringing and noise in the performance of the device.

Figure 3A:
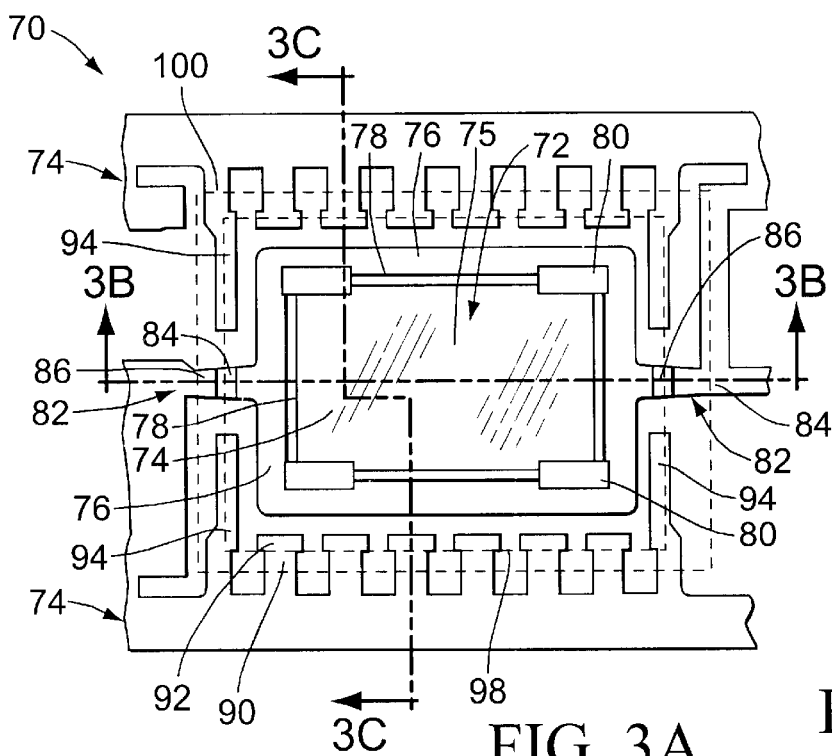
FIG. 3A is a top plan view of a lead frame in accordance with the present invention for use in a high frequency semiconductor device package.

FIG. 3A shows a top plan view of a lead frame at 70 in accordance with the present invention for use in a high frequency semiconductor device package, the depicted lead frame being shown in an intermediate phase of manufacture after a preliminary cutting step, and after a coining step as further explained below. The lead frame 70 includes: a down-set paddle structure 72 formed in a central area of the lead frame; and a lead assembly 74 disposed proximate each of a pair of opposites sides of the down-set paddle structure 72. In one embodiment of the present invention, a matrix of lead frames like the lead frame 70 is formed by cutting and coining a metal sheet. Also in varying embodiments, the metal sheet may be formed from any of a variety of conductive materials such as copper, alloy materials, or any other suitable conductive material.

The down-set paddle structure 72 includes: a centrally disposed lower paddle section 75 having a generally rectangular shape; an upper mesa section 76 surrounding the lower paddle section 75 and being disposed above the lower paddle section; a connecting wall 78 fixed between the lower paddle section 75 and the upper mesa section 76 of the paddle structure; a plurality of relief holes 80 for facilitating the coining of the paddle structure 72, each hole being formed through a corresponding area of the paddle structure that is disposed proximate one of the four corners of the lower paddle section 75 of the paddle structure, each corresponding hole area including a portion of the lower paddle section 75, a portion of the upper mesa section 76, and a portion of the connecting wall 78 of the paddle structure; a pair of tie bars, or supporting tabs, 82 extending axially away from medial portions of each of two opposite edges of the upper mesa section 76 of the paddle structure, each of the tie bars 82 having an upper distal section 84 being disposed above the upper mesa section 76 of the paddle structure in a plane substantially parallel to the plane of the upper mesa section 76 of the paddle structure, and a riser section 86 joining the upper distal section 84 of the tie bar and the upper mesa section of the paddle structure. The tie bars 82 provide the functions of holding the entire lead frame/die assembly together while it is being encapsulated, and stabilizing the paddle structure after molding.

In accordance with the present invention, the height of the upper mesa section 76 above the lower paddle section 75 of the paddle structure, and the width and surface area of the mesa section 76 may vary depending on application requirements. In varying embodiments of the present invention, the connecting wall 78, which provides a riser between the lower paddle section and the upper mesa section of the paddle structure, may form angles ranging between zero and ninety degrees relative to the surfaces of the lower paddle section and the upper mesa section.

The lead assembly 74 of the lead frame 70 is cut to be electrically isolated from the down-set paddle structure 72, and includes: a plurality of leads 90, each post having a distal end portion forming a lead stitch post 92 providing a platform for wire bonding as further explained below; and a plurality of end leads 94 disposed proximate a corresponding one of four corners of the down-set paddle structure 72, each end lead stitch post also providing a platform for wire bonding as further explained below. In one embodiment, in order to maximize conductivity for the wire bonding, each lead stitch post 92 of each of the leads 90, and a portion of each of the end leads 94 is plated with a highly conductive material such as silver as indicated by a first dashed line 98. A second dashed line 100 indicates a boundary line for encapsulating the lead frame 70 with a plastic material in accordance with any of a variety of well known methods.

Figure 3C:
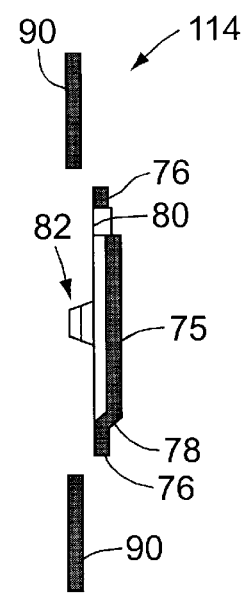
FIG. 3C is a transverse cross sectional side view of the lead frame of FIG. 3A taken generally along the line 3C—3C of FIG. 3A.
Figure 3B:
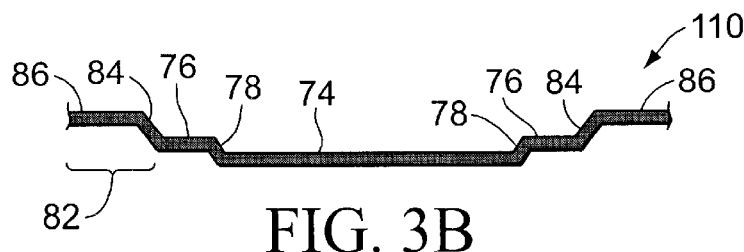
FIG. 3B is an axial cross sectional side view of the lead frame of FIG. 3A taken generally along the line 3B—3B of FIG. 3A.

FIG. 3B shows an axial cross sectional side view of the lead frame 70 (FIG. 3A) at 110 taken generally along the 3B—3B of FIG. 3A. In the depicted embodiment, the connecting wall extends upward a short distance and at an angle much less than 90 degrees relative to the lower paddle section 75 of the paddle structure 70. The tie bars 82 recess the entire paddle downwards until the backside of the paddle sits flush against a mold cavity (not shown) so as to prevent plastic compound from flowing onto the metal surface area.

FIG. 3C shows a transverse cross sectional side view of the lead frame 70 (FIG. 3A) at 114 taken generally along the 3C—3C of FIG. 3A. Note that one of the tie bars 82 is shown behind the cross sectional reference plane in order to illustrate that the tie bars 82 are disposed above the upper mesa section 76 of the paddle structure.

Figure 4B:
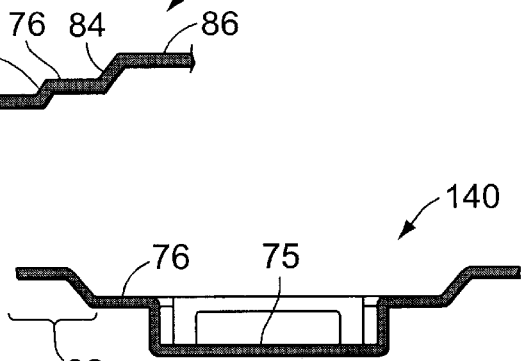
FIG. 4B is an axial cross sectional side view of the lead frame of FIG. 4B taken generally along the line 4B—4B of FIG. 4A.
Figure 4A:
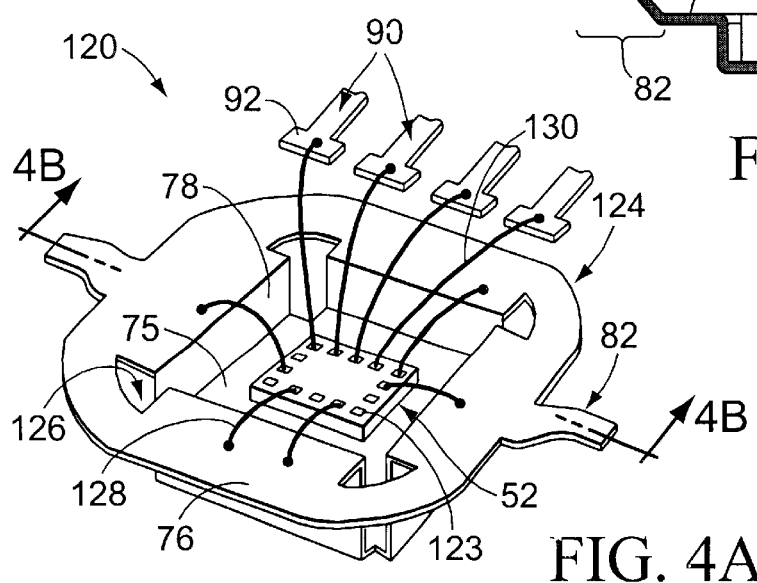
FIG. 4A is a perspective view of a lead frame in accordance with an alternative embodiment of the present invention which is slightly modified from the lead frame of FIG. 3A.

FIG. 4A shows a perspective view of a lead frame at 120 in accordance with an alternative embodiment of the present invention, the lead frame 120 having a die 52 attached thereto. The lead frame 120 is slightly modified from the lead frame 70 (FIG. 3A). The lead frame 120 includes a paddle structure 124 which is similar to the paddle structure 72 (FIG. 3A) but is different in that it has a plurality of holes 126 which are shaped differently from the holes 80 (FIG. 3A), and it is also different in that the connecting wall 78 extends upwards at an angle of approximately 90 degrees relative to the lower paddle section 75 of the paddle structure 120. The holes 126, like the holes 80 (FIG. 3A), are formed through a corresponding area of the paddle structure 124 that is disposed proximate one of the four corners of the lower paddle section 75 of the paddle structure, each hole being formed through a portion of the lower paddle section 75, the upper mesa section 76, and the connecting wall 78 of the paddle structure. The holes 80 (FIG. 3A) and the holes 126 facilitate folding of the metal sheet to form the connecting wall 78 between the lower paddle section 75 and the upper mesa section 76 of the paddle structure 70 (FIG. 3A) and the paddle structure 124 during the coining step. FIG. 4A also shows: a plurality of relatively short ground wires 128 connecting selected ones of a plurality of bond pads 123 of the die 52 to the upper mesa section 76 of the paddle structure 124; and a plurality of wires 130 connecting selected ones of the bond pads 123 of the die to lead stitch post 92 of corresponding selected ones of the leads 90. Note that the connecting walls 78 provide an advantage by serving as barriers to moisture penetration into the semiconductor packaged device along the periphery of the exposed metal paddle area.

FIG. 4B shows an axial cross sectional side view of the lead frame 120 (FIG. 4A) at 140 taken generally along the line 4B—4B of FIG. 4A. Note that the connecting wall 78 extends upwards at an angle of approximately 90 degrees relative to the lower paddle section 75 of the paddle structure 120, and also that the connecting wall 78 extends upward significantly further than the mesa of the paddle structure 70 in FIG. 3B.

Figure 5A:
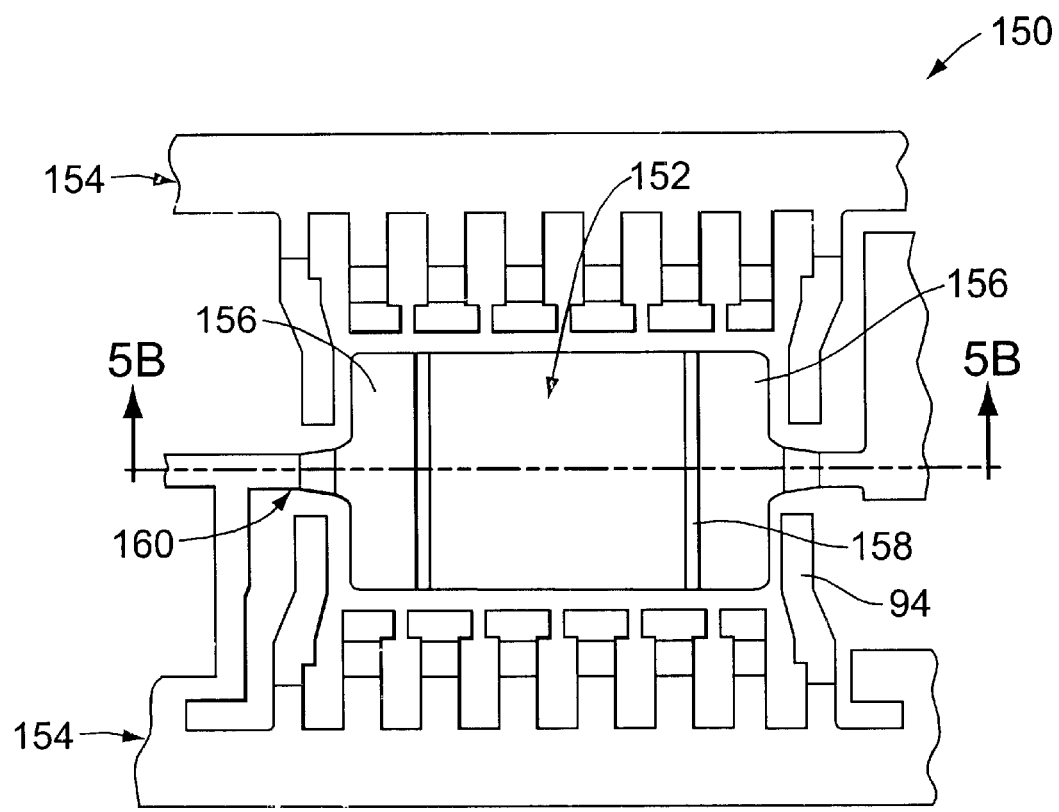
FIG. 5A is a top plan view of a lead frame in accordance another embodiment of the present invention, the depicted lead frame including a paddle structure having end mesas formed at opposite ends of a paddle area.

FIG. 5A shows a top plan view of a lead frame at 150 in accordance another embodiment of the present invention, the depicted lead frame 150 including a down-set paddle structure 152 having a pair of end mesas as further explained below; and a lead assembly 154 disposed proximate each of a pair of opposites sides of the down-set paddle structure 152.

The down-set paddle structure 152 is similar to the down-set paddle structure 72 (FIG. 3A) except that the paddle structure 152 includes end mesas 156 formed at opposite edges of a lower paddle section of the paddle structure 152, as opposed to the ring shaped mesa 76 (FIG. 3A) which completely surrounds the lower paddle section of the paddle structure 72 (FIG. 3A). The paddle structure 152 includes: a centrally, or medially, disposed lower paddle section 154 having a generally rectangular shape; the end mesa sections 156 being formed at opposite edges of the lower paddle section 154, the end mesa sections 156 having a top surface that is disposed at a vertical distance relative to the lower paddle section 154; and first and second end connecting walls 158 fixed between the lower paddle section 154 and the end mesa sections 156 of the paddle structure.

Note that relief holes, such as the holes 80 (FIG. 3A), are not required for forming the down-set paddle structure 152 because the end connecting walls 158 do not completely surround the lower paddle section 154 of the paddle structure. The paddle structure 152 further includes a plurality of tie bars, or supporting tabs, 160 which are similar to the tie bars 82 (FIG. 3A). In accordance with the present invention, the height of the end mesa sections 156 relative to the lower paddle section of the paddle structure, and the size of the end mesa sections 156 may vary depending on application requirements. Also, in varying embodiments of the present invention, the end connecting wall 158, which provides a riser between the lower paddle section and the end mesa section of the paddle structure, may form angles ranging between zero and ninety degrees relative to the surfaces of the lower paddle section and the end mesa sections of the paddle structure.

Figure 5B:
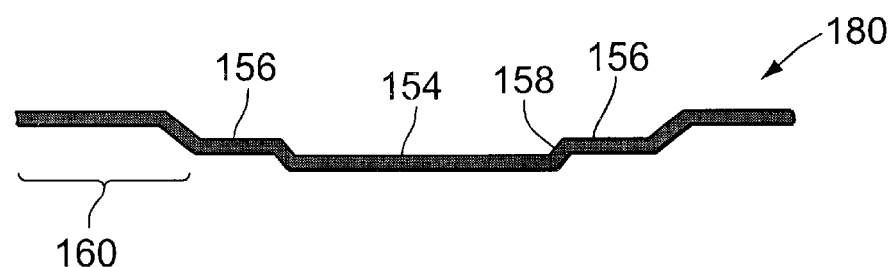
FIG. 5B is an axial cross sectional side view of the lead frame of FIG. 5A taken generally along the line 5B—5B of FIG. 5A.

FIG. 5B shows an axial cross sectional side view at 180 of the lead frame 150 (FIG. 5A) taken generally along the line 5B—5B of FIG. 5A. Note that in the depicted embodiment, each of the end connecting walls 158 provides a riser between the lower paddle section 154 of the paddle structure and a corresponding one of the end mesa sections 156 of the paddle structure, each of the end connecting walls 158 forming an angle of approximately 45 degrees relative to the surface of the lower paddle section 154 and relative to the surface of the corresponding end mesa section 156.

Figure 6:
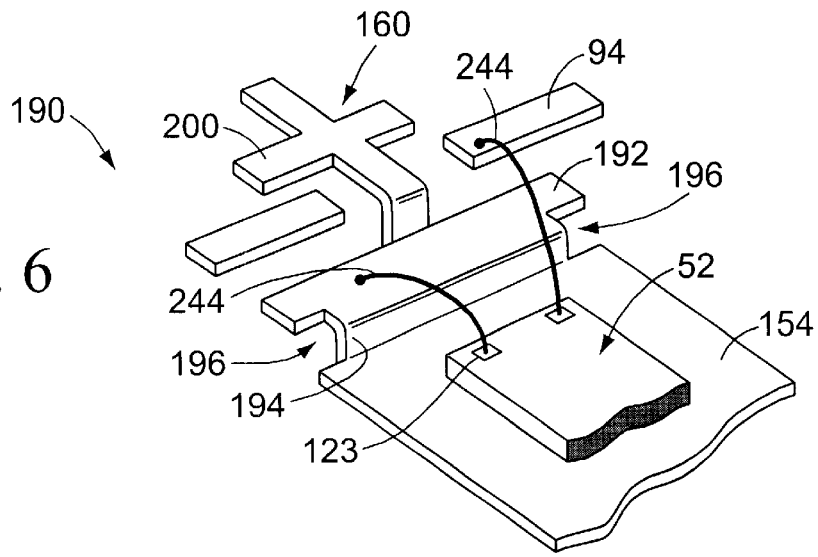
FIG. 6 is a perspective view of an alternative embodiment of the paddle structure of FIG. 5A.

FIG. 6 shows a partial cut away perspective view of an alternative embodiment of the end mesa paddle structure 152 (FIG. 5A) at 190. The paddle structure 190 includes a centrally, or medially, disposed lower paddle section 154 having a generally rectangular cross section; an end mesa section 192 formed at a distal edge of the lower paddle section 154; and an end connecting wall 194 fixed between the lower paddle section 154 and the end mesa section 192 of the paddle structure. In the depicted embodiment of the end mesa paddle structure, notched relief corners 196 are formed in the paddle structure at outer side areas of the end connecting wall 194 and the end mesa section 192 in order to simplify the coining of the paddle structure to form the angles between the surfaces of the lower paddle section 154, the end connecting wall 194, the end mesa section 192 of the paddle structure. Also, in the depicted embodiment, the tie bar 160 includes a cross bar 200 extending outward from opposite sides of the tie bar, the cross bar for providing a locking function for holding the paddle structure firmly in the package during fabrication of the package as mentioned above, and also to hold the lead frame securely inside a plastic body of the package. Wires 200 may be bonded to provide connections between selected bond pads 123 of the die 52 and the end leads 94 of the frame, and between selected bond pads 123 of the die and the end mesa section 192.

Figure 7A:
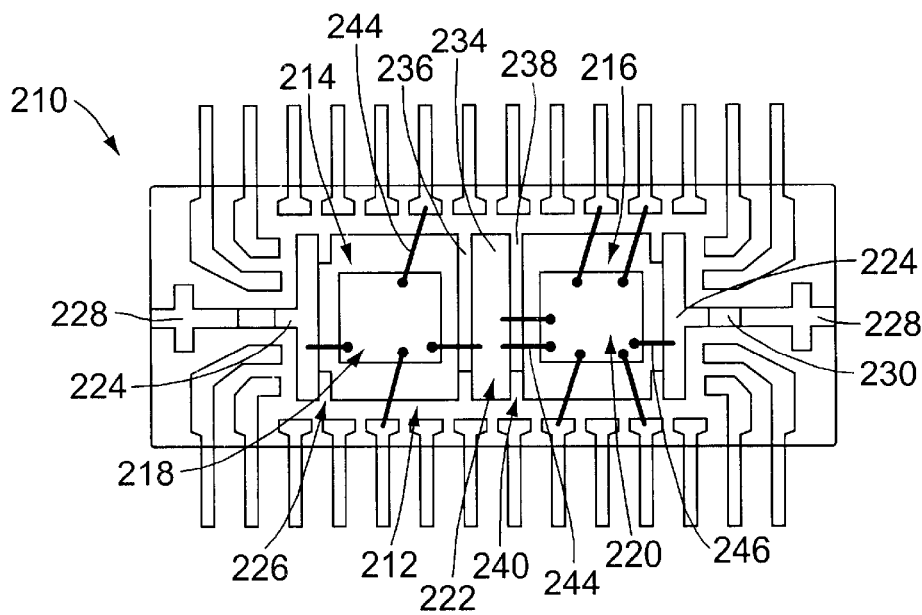
FIG. 7A is a top plan view of a lead frame in accordance yet another embodiment of the present invention, the depicted lead frame including a paddle structure having selectively located mesas formed in selected areas of the paddle structure for the purpose of reducing selected wire lengths.

FIG. 7A shows a top plan view of a lead frame in accordance yet another embodiment of the present invention at 210, the lead frame 210 including a paddle structure 212 having first and second base sections 214 and 216 providing flag attach areas for a first die 218 and a second die 220 respectively, the paddle structure 212 also having selectively located mesas formed in selected areas of the paddle structure for the purpose of minimizing lengths of bond wires. The paddle structure 212 includes: a center mesa 222 formed between the first and second lower paddle sections 214 and 216 as further explained below; and a pair of end mesa sections 224 formed at opposite distal edges of the paddle structure 212, the end mesa sections 224 being disposed at a vertical distance relative to corresponding ones of the base sections 214 and 216. The end mesa sections 224 are similar to the end mesa sections 156 of the paddle structure 150 (FIG. 5A), and may be formed with relief notches 226 similar to the relief notches 196 (FIG. 6). The paddle structure 212 also includes tie bars, or supporting tabs, 228 similar to the tie bars 160 (FIG. 6), the tie bars 228 having a distal section being disposed above the corresponding one of the end mesa sections 224 of the paddle structure, and a riser portion 230 fixed between the distal section of the tie bar and the corresponding one of the end mesa sections 224 of the paddle structure.

The center mesa 222 of the paddle structure 212, which is formed between the first and second lower paddle sections 214 and 216 of the paddle structure, includes: a central upper mesa section 234; a first central connecting wall 236 fixed between the first lower paddle section 214 and the central upper mesa section 234; and a second central connecting wall 238 fixed between the second base section 216 and the central upper mesa section 234. Each of the first and second central connecting walls may form angles ranging between zero and ninety degrees relative to the surfaces of the first and second lower paddle sections 214 and 216 of the paddle structure. Similar to the end mesa sections 224, the center mesa 222 may be formed with relief notches 240 similar to the relief notches 226.

Figure 7B:
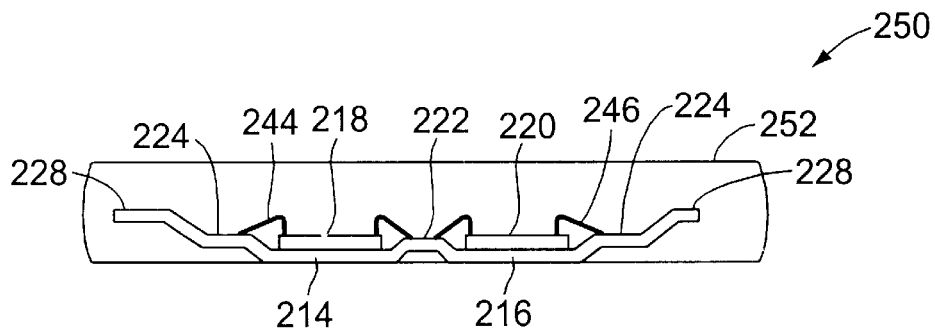
FIG. 7B is an axial cross sectional side view of the lead frame of FIG. 7A.

The center mesa 222 of the paddle structure 212 provides for minimizing lengths of bond wires 244 connecting bond pads of the first and second dies 218 and 220 to the center mesa 222. The end mesa sections 224 of the paddle structure 212 provide for minimizing lengths of bond wires 246 connecting bond pads of the first and second dies 218 and 220 to corresponding ones of the end mesa sections 224. FIG. 7B shows an axial cross sectional side view of the lead frame 210 (FIG. 7A) at 250. The lead frame at 250 is encapsulated by plastic molding compound material 252.

Figure 8:
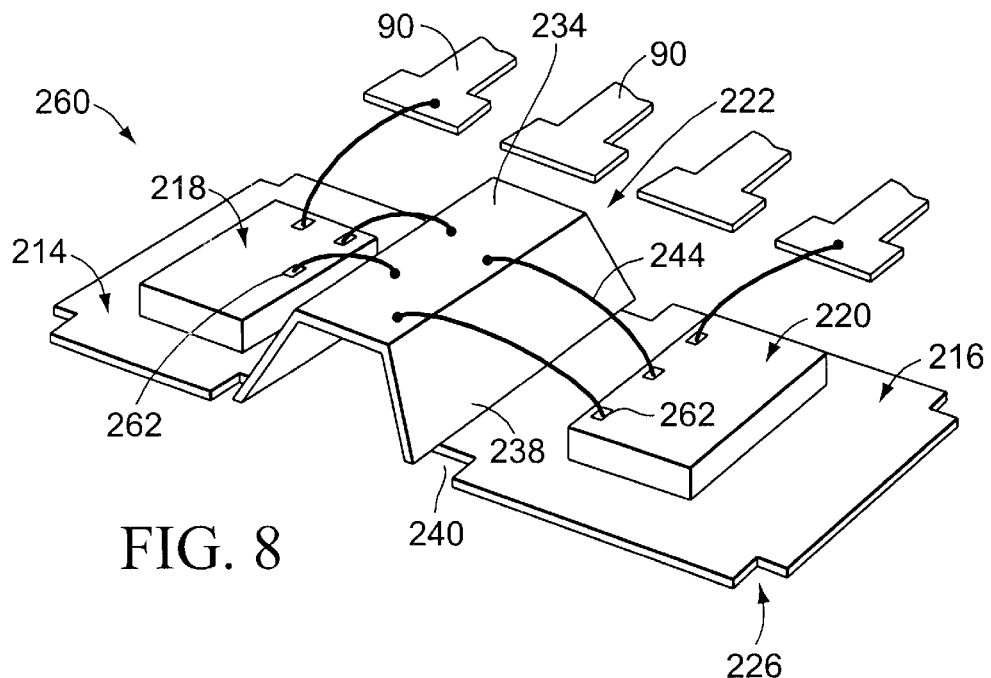
FIG. 8 is a partial cut away perspective view of the lead frame of FIG. 7A.

FIG. 8 is a partial cut away perspective view of the lead frame 210 (FIG. 7A), the view illustrating wire bonding between bond pads 262 of the first and second dies 218 and 220 and the central upper section 234 of the central mesa 222.

Figures 9A, 9B:
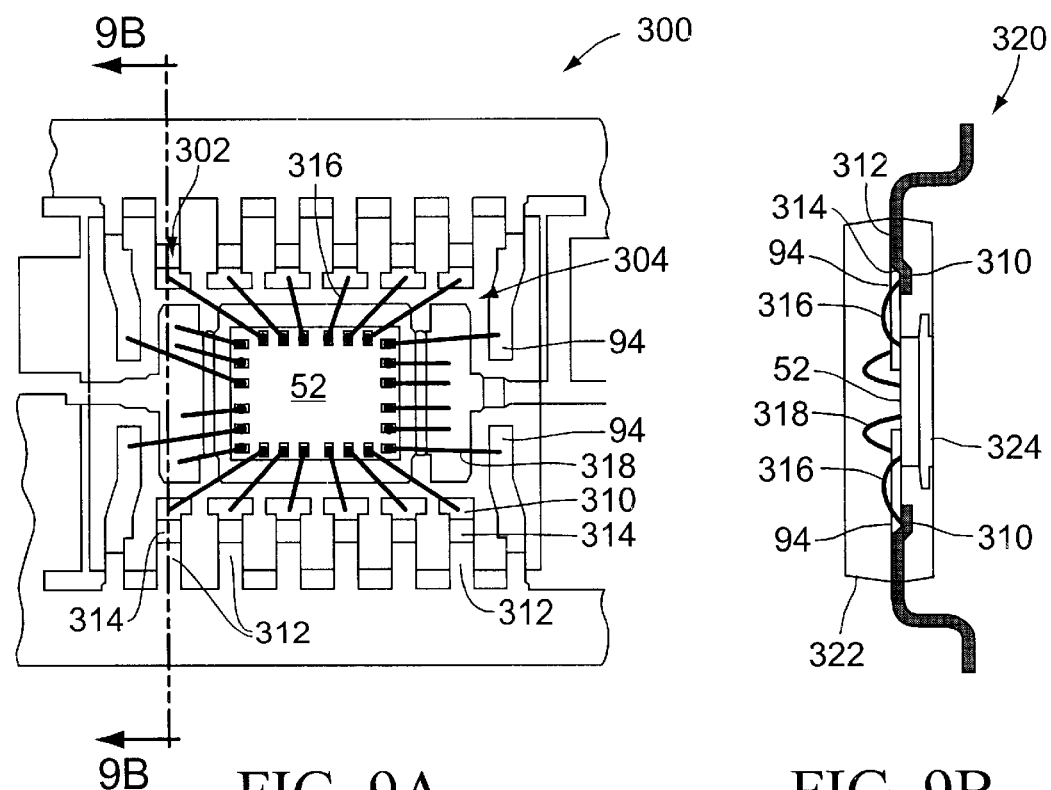
FIG. 9A is a top plan view of a lead frame in accordance with a further embodiment of the present invention, the depicted lead frame including down-set leads which provide for reduced length bond wires.
FIG. 9B is a transverse cross sectional side view of the lead frame of FIG. 9A taken generally along the line 9B—9B of FIG. 9A.

FIG. 9A shows a top plan view of a lead frame in accordance yet another embodiment of the present invention at 300, the lead frame 300 including down-set lead posts 302. The lead frame 300 includes a paddle structure 304 similar to the paddle structure 190 (FIG. 6) providing an attach flag for a die 52; a plurality of the down-set leads 302; and a plurality of end leads 94.

Each of the down set leads 302 includes: a lowered lead stitch post 310 disposed proximate the die 52 and providing a surface for wire bonding; an upper lead section 312 disposed at a different elevation than the lowered lead stitch post 310; and a medial riser section 314 joining the lead stitch post 310 and the upper lead section 312 of the down set lead. The down-set leads 302 provide for reduced length bond wires 316 connecting the lowered lead stitch post 310 of the down-set leads to corresponding selected ones of the bond pads of the die 52.

FIG. 9B shows a transverse cross sectional side view of the lead frame 300 (FIG. 9A) at 320 taken generally along the line 9B—9B of FIG. 9A. The lead frame 300 is encapsulated by plastic molding compound material 322. Note that a bottom side 324 of the paddle structure 304 is exposed to provide enhanced heat dissipation, and also to provide electrical grounding of the semiconductor package. In varying embodiments of the present invention, the lengths of the lead posts may be varied.

Figure 10:
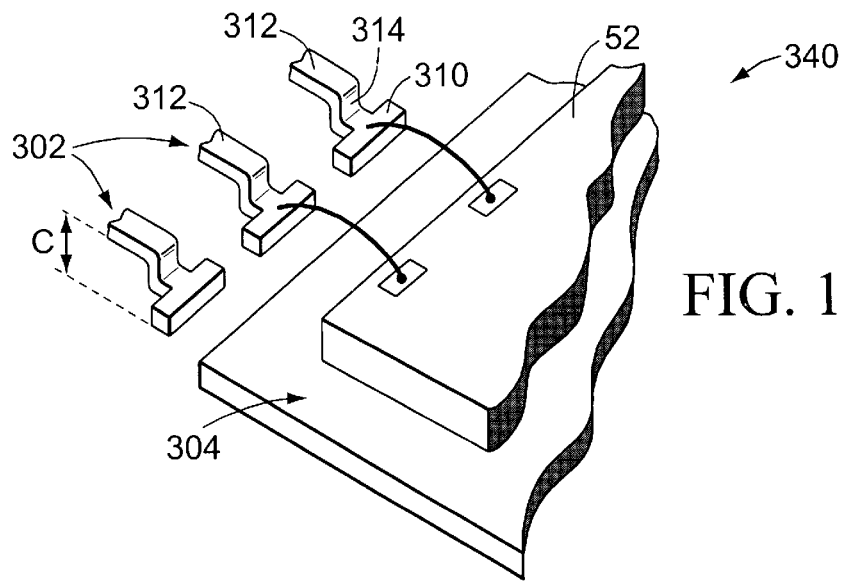
FIG. 10 is a partial cut away perspective view of the lead frame of FIG. 9A.

FIG. 10 shows a partial cut away perspective view of the lead frame 300 (FIG. 9A) at 340, the view illustrating the reduced length bond wires 316 connected between selected ones of the bond pads of the die 52 and the lowered lead stitch posts 310 of the down set leads 302. In accordance with the present invention, the height of the lead stitch posts 310 may be varied by varying a lead frame stamping process in order to vary the angle formed between the medial riser sections 314 and the leads 312 of the down-set leads 302, and also in order to vary the angle formed between the medial riser sections 314 and the lead stitch posts 310. Also, the lengths of each of the leads 312, medial riser sections 314, and lead stitch posts 310 may be varied by varying the lead frame stamping process. The difference between the heights of the lead stitch posts 310 and the leads 312 is illustrated as "C".

FIG. 11 shows a perspective view of a portion of a lead frame in accordance with an additional embodiment of the present invention at 350, the lead frame 350 including: a flat paddle section 352; and an integrally formed mesa member 354 attached to the paddle structure area 352 via conductive epoxy 356, the mesa member 354 having a rectangular cross section and having a top surface disposed at a vertical distance relative to the surface of the paddle section. In an alternative embodiment, the mesa member 354 is attached to the surface of the paddle section via a conductive tape.

The advantage of the lead frame 350 is that the location of the integrally formed mesa member 354 on the flat paddle section 352 may be varied. As for each of the above described mesa paddle structure configurations of the present invention, the mesa member 354 allows for using reduced length bond wires 358. The attached mesa member 354 may be electrically connected to the paddle structure via conductive epoxy or tape, or may be electrically isolated from the paddle structure by insulative epoxy or tape. The mesa member may be electrically isolated from the lower paddle section in order to facilitate common connections of contact pads of a die as shown.

FIG. 12 shows a perspective view of a lead frame in accordance with yet another embodiment of the present invention at 370, the depicted lead frame including: a flat paddle structure 372 providing a die attach flag for mounting a plurality of dies; and an attached framed or stamped mesa structure 374 attached to the paddle structure 372 by conductive epoxy or tape, the mesa structure 374 being formed from a planar sheet and having a plurality of apertures, or holes, 376 formed therethrough. In accordance with the present invention, the location and size of the apertures 376 of the mesa structure 374 may be varied to expose areas of the paddle structure 372, each of the exposed areas of the paddle structure providing a die attach flag for a corresponding die. The remaining portions of the mesa structure 374 provide surfaces for bonding wires connected between bond pads of the dies and the mesa structure. In the depicted embodiment, the mesa structure 374 has three apertures formed therethrough for exposing three areas of the paddle structure 372, each providing an area for attaching a corresponding one of three dies 382, 384, and 386. The paddle structure 372 includes tie bars 378 extending from opposite ends of the paddle structure 372. The tie bars 378 may be configured similarly to any of the above described tie bars.

Although the present invention has been particularly shown and described above with reference to a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. An improved lead frame structure for use in a semiconductor package, comprising:

a plurality of leads;

a paddle structure electrically isolated from said leads, said paddle structure including at least one lower paddle section having a first top surface to which a die may be attached, at least one mesa section disposed proximate said paddle section and having a second top surface disposed at a different elevation than said first top surface, said lower paddle section and said mesa section being joined by a wall section; and a plurality of tie bars attached to said paddle structure for supporting said paddle structure;

whereby contact pads of a die attached to said first top surface and having an upper surface may be electrically connected to said second top surface or to said leads via an associated connection means prior to encapsulation thereof, wherein the distance between the upper surface of the die and said second top surface is less than the distance between the upper surface of the die and said first top surface of said lower paddle structure so that the length of said connection means is minimized to reduce impedance of said connection means to reduce induction effects on die performance at high frequencies, and further wherein said mesa section is electrically isolated from said first top surface of said lower paddle section.

2. An improved lead frame structure as recited in claim 1 wherein at least one of said leads comprises:

a lead stitch post disposed at a distal end of said lead and providing a surface for wire bonding;

an upper lead section disposed at a different elevation than said lead stitch post; and a medial riser section joining said lead stitch post and said upper lead section.

3. An improved lead frame structure as recited in claim 1 wherein said paddle section of said paddle structure is formed by a planar member having a substantially rectangular shape, and wherein said mesa section surrounds said lower paddle section.

4. An improved lead frame structure as recited in claim 1 wherein said second top surface comprises a continuous surface that surrounds said first top surface.

5. An improved lead frame structure as recited in claim 4 wherein said paddle structure is formed by coining a generally rectangular lead frame portion having a plurality of relief holes disposed proximate corners thereof.

6. An improved lead frame structure as recited in claim 3 wherein said paddle structure further comprises relief holes formed through portions of said lower paddle section, portions of said connecting wall, and portions of said upper mesa section, said relief holes being disposed proximate corners of said lower paddle section.

7. An improved lead frame structure as recited in claim 1 further comprising a plurality of tie bars extending from opposite edges of said paddle structure, said tie bars for stabilizing said paddle structure during package fabrication.

8. An improved lead frame structure as recited in claim 7 wherein said tie bars extend axially away from medial portions of each of two opposite edges of said mesa section, each of said tie bars having an upper distal section disposed at a distance relative to said mesa section, and a riser portion disposed between said upper distal section of said tie bar and said mesa section of said paddle structure.

9. An improved lead frame structure as recited in claim 1 wherein said paddle structure comprises a plurality of mesa sections disposed at opposite sides of said lower paddle section.

10. An improved lead frame structure as recited in claim 1 wherein said paddle structure comprises a first paddle section and a second paddle section, and wherein said mesa section is disposed between said first and second paddle sections.

11. An improved lead frame structure as recited in claim 10 further comprising:
   a first connecting wall joining said first paddle section and said mesa section; and
   a second connecting wall joining said second paddle section and said mesa section.

12. An improved lead frame structure as recited in claim 1 wherein said mesa section is affixed to said first top surface.

13. An improved lead frame structure as recited in claim 12 wherein said mesa section and said wall section are formed by a mesa member having a rectangular cross section, said mesa member being affixed to said first top surface.

14. An improved lead frame structure as recited in claim 13 wherein said mesa member is affixed to said first top surface by conductive epoxy.

15. An improved lead frame structure as recited in claim 13 wherein said mesa member is electrically isolated from said lower paddle section to facilitate common connections of contact pads of a die.

16. An improved lead frame structure as recited in claim 1 wherein said mesa section comprises a plate affixed to said first top surface, said plate having at least one aperture formed therethrough to expose said first top surface.

17. A packaged semiconductor device comprising:
   an improved lead frame structure including,
      a plurality of leads,
      a paddle structure electrically isolated from said leads, said paddle structure including a lower paddle section having a first top surface to which a die may be attached, at least one mesa section disposed proximate said paddle section and having a second top surface disposed at a different elevation than said first top surface, said lower paddle section and said mesa section being joined by a wall section, and
      a plurality of tie bars attached to said paddle structure for supporting said paddle structure;
   a semiconductor die mounted on said first top surface of said paddle section, said die having an upper surface and a plurality of bond pads;
   connection means for electrically coupling selected ones of said leads to selected ones of said bond pads; and
   grounding connection means for electrically coupling selected ones of said bond pads to said second top surface of said mesa section, wherein the distance between said upper surface of said die and said second top surface is less than the distance between said upper surface of said die and said first top surface of said lower paddle structure whereby the length of said connection means is minimized to reduce impedance of said connection means to reduce induction effects on die performance at high frequencies, and further wherein said mesa section is electrically isolated from said first top surface of said lower paddle section.

18. A packaged semiconductor device as recited in claim 17 further comprising:
   a plastic encapsulation covering said die, said connection means, said grounding connection means, said mesa section, said first top surface of said paddle section, and portions of said leads;
   wherein said paddle section includes a bottom surface that is exposed to form a lower surface of said packaged semiconductor device, said exposed surface for providing electrical grounding and heat dissipation.

19. A semiconductor package as recited in claim 17 wherein each of said leads comprises a lead stitch post located at a distal end of the lead, and wherein said connection means comprises wires bonded between the lead stitch posts and selected locations of said die.

20. A semiconductor package as recited in claim 17 wherein said ground connection means comprises wires bonded between said top surface of said upper mesa section and selected locations of said die.

21. A semiconductor package structure as recited in claim 17 wherein at least one of said leads comprises:
   a lead stitch post disposed at a distal end of said lead and providing a surface for wire bonding;
   an upper lead section disposed at a different elevation than said lead stitch post; and
   a medial riser section joining said lead stitch post and said upper lead section.

22. A semiconductor package structure as recited in claim 17 wherein said paddle section of said paddle structure is formed by a planar member having a substantially rectangular shape, and wherein said mesa section surrounds said lower paddle section.

23. A semiconductor package structure as recited in claim 17 wherein said second top surface comprises a continuous surface that surrounds said first top surface.

24. A semiconductor package structure as recited in claim 23 wherein said paddle structure is formed by coining a generally rectangular lead frame portion having a plurality of relief holes disposed proximate corners thereof.

25. A semiconductor package structure as recited in claim 17 wherein said paddle structure further comprises relief holes formed through portions of said lower paddle section, portions of said connecting wall, and portions of said upper mesa section, said relief holes being disposed proximate corners of said lower paddle section.

26. A semiconductor package structure as recited in claim 17 further comprising a plurality of tie bars extending from opposite edges of said paddle structure, said tie bars for stabilizing said paddle structure during package fabrication.

27. A semiconductor package structure as recited in claim 26 wherein said tie bars extend axially away from medial portions of each of two opposite edges of said upper mesa section, each of said tie bars having an upper distal section disposed at a distance relative to said upper mesa section, and a riser portion disposed between said upper distal section of said tie bar and said upper mesa section of said paddle structure.

28. A semiconductor package structure as recited in claim 17 wherein said paddle structure comprises a plurality of mesa sections disposed at opposite sides of said lower paddle section.

29. A semiconductor package structure as recited in claim 17 wherein said paddle structure comprises a first paddle section and a second paddle section, and wherein said mesa section is disposed between said first and second paddle sections.

30. A semiconductor package structure as recited in claim 29 further comprising:
   a first connecting wall joining said first paddle section and said mesa section; and
   a second connecting wall joining said second paddle section and said mesa section.

31. A semiconductor package structure as recited in claim 17 wherein said mesa section is affixed to said first top surface.

32. A semiconductor package structure as recited in claim 31 wherein said mesa section and said wall section are formed by a mesa member having a rectangular cross section, said mesa member being affixed to said first top surface.

33. A semiconductor package structure as recited in claim 32 wherein said mesa member is affixed to said first top surface by conductive epoxy.

34. A semiconductor package structure as recited in claim 32 wherein said mesa member is electrically isolated from said lower paddle section to facilitate common connections of contact pads of a die.

35. A semiconductor package structure as recited in claim 17 wherein said mesa section comprises a plate affixed to said first top surface, said plate having at least one aperture formed therethrough to expose said first top surface.

* * * * *